(12) United States Patent
Winslow

(10) Patent No.: US 8,384,484 B2
(45) Date of Patent: Feb. 26, 2013

(54) POWER AMPLIFIER WITH IMPROVED BANDWIDTH

(75) Inventor: Thomas A. Winslow, Salem, VA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 13/157,602

(22) Filed: Jun. 10, 2011

(65) Prior Publication Data

US 2012/0206206 A1  Aug. 16, 2012

Related U.S. Application Data

(60) Provisional application No. 61/441,823, filed on Feb. 11, 2011.

(51) Int. Cl.
*H03F 3/191* (2006.01)

(52) U.S. Cl. ......................................... 330/302; 330/195

(58) Field of Classification Search .................. 330/192, 330/195, 302
See application file for complete search history.

(56) References Cited

U.S. PATENT DOCUMENTS 7,683,718 B2 * 3/2010 Dishop ......................... 330/276
7,928,802 B2 * 4/2011 Ohnishi et al. ................ 330/286

OTHER PUBLICATIONS

Conway, David, et al., "New process enables wideband high-power GHz amplifiers to deliver up to 20 W", www.rfdesign.com, Feb. 2006, pp. 8-11.

* cited by examiner

*Primary Examiner* — Khanh V Nguyen
(74) *Attorney, Agent, or Firm* — Christopher P. Maiorana, PC

(57) ABSTRACT

An amplifier output impedance matching configuration including a first impedance transformer and one or more second impedance transformers. The first impedance transformer receives input signals from a power amplifier and generates output signals to a load. The one or more second impedance transformers are connected between the first impedance transformer and the load through which the output signals are passed.

20 Claims, 9 Drawing Sheets

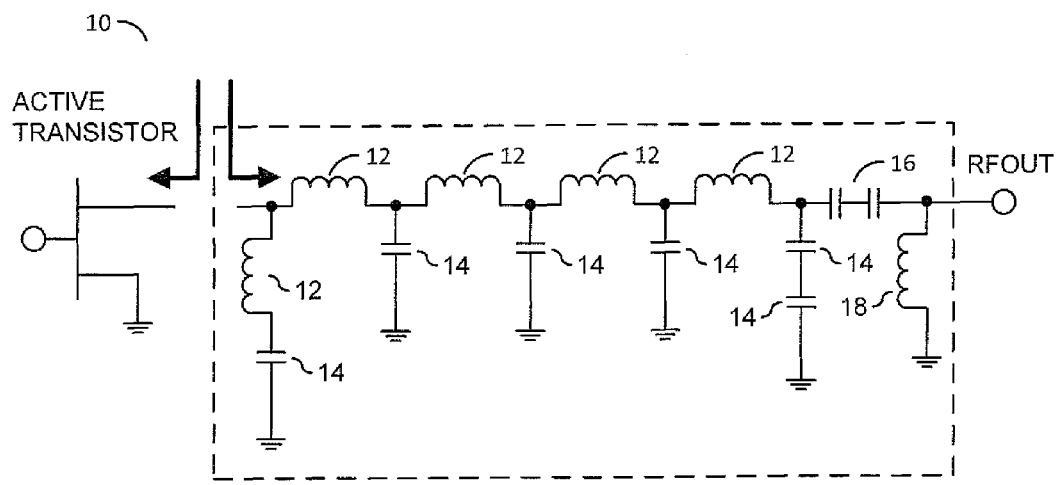
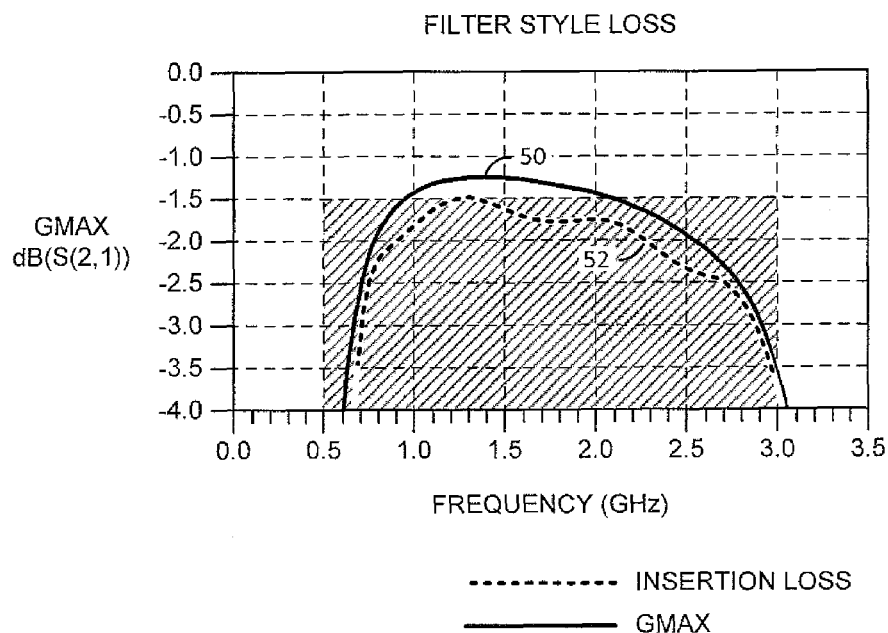
FIG. 4A
(CONVENTIONAL)

POWER AMPLIFIER WITH IMPROVED BANDWIDTH

RELATED APPLICATIONS

This application claims the benefit of U.S. Provisional Application No. 61/441,823, filed Feb. 11, 2011, and which is hereby incorporated by reference in its entirety.

FIELD OF THE INVENTION

The present invention relates to signal processing generally and, more particularly, to a method and/or apparatus for implementing a power amplifier with improved bandwidth on monolithic microwave integrated circuits (MMICs).

BACKGROUND OF THE INVENTION

Conventional monolithic microwave integrated circuit (MMIC) power amplifiers, depending on the frequency band, are power matched using lumped element capacitors, inductors and transmission lines on a Gallium Arsenide (GaAs), Silicon (Si), or Silicon Carbide (SiC) substrate. Very broad band (i.e., multi-octave) high-power amplifiers are difficult to power match due to extremely low impedances, and cumulative non-idealities in the lumped element and distributed matching elements at opposite ends of the frequency bands.

The cumulative loss of the matching elements can make broadband matching networks very lossy. In multi-octave bandwidth designs, required frequency operation of the amplifier can approach the resonant frequency of the inductors and capacitors used for impedance matching, which contributes significant non-idealities into the design and synthesis process. The significant non-idealities are due to the limited bandwidth and Q (quality factor) of the lumped element inductors and capacitors themselves. The use of a single stage MMIC compatible impedance transformer to overcome the limited bandwidth, Q, and non-idealities of lumped element matching elements has been demonstrated in power amplifiers with limited success.

It would be desirable to have a method for output matching of high power amplifiers over broad bandwidth that overcomes the limited bandwidth, Q, and non-idealities of lumped element matching elements.

SUMMARY OF THE INVENTION

The present invention concerns an amplifier output impedance matching configuration including a first impedance transformer stage and one or more second impedance transformer stages. The first impedance transformer stage receives input signals from a power amplifier and generates output signals to a load. The one or more second impedance transformer stages are connected between the first impedance transformer stage and the load through which the output signals are passed.

The objects, features and advantages of the present invention include providing a power amplifier with improved bandwidth that may (i) be implemented on monolithic microwave integrated circuits (MMICs), (ii) implement an output impedance matching network comprising at least two series-coupled MMIC compatible broadside coupled impedance transformers, (iii) provide ESD protection at an RF output lead, (iv) provide improved insertion loss, (v) provide broader bandwidth and higher gain, and/or (v) allow bias to be supplied through the transformers.

BRIEF DESCRIPTION OF THE DRAWINGS

These and other objects, features and advantages of the present invention will be apparent from the following detailed description and the appended claims and drawings in which:

FIGS. 4A and 4B are diagrams illustrating a comparison of topology and performance between the conventional filter-based and the novel dual-series transformer-based output matching network designs illustrated in FIG. 3, respectively;

DETAILED DESCRIPTION OF THE PREFERRED EMBODIMENTS

A high-power amplifier monolithic microwave integrated circuit (MMIC) in accordance with an embodiment of the present invention generally utilizes a dual stage transformer output matching network to overcome the limited bandwidth, Q, and non-idealities of conventional lumped element matching elements. However, additional stages (e.g., triple, quadruple, etc.) may be implemented accordingly to meet the design criteria of a particular implementation. Embodiments of the present invention may provide multistage impedance transformers in MMIC power amplifier output matching and interstage matching networks. The output matching network is generally the most critical for achieving broadband performance and is generally the main limiting factor for achieving power specifications. The multistage impedance transformers in accordance with embodiments of the present invention may also provide a benefit in that the final stage transformer in the output matching network may provide significant electrostatic discharge (ESD) protection. For example, the final stage transformer generally forms a direct shunt path to ground for an ESD strike at an RF output lead connected to the matching network.

Figure 1:
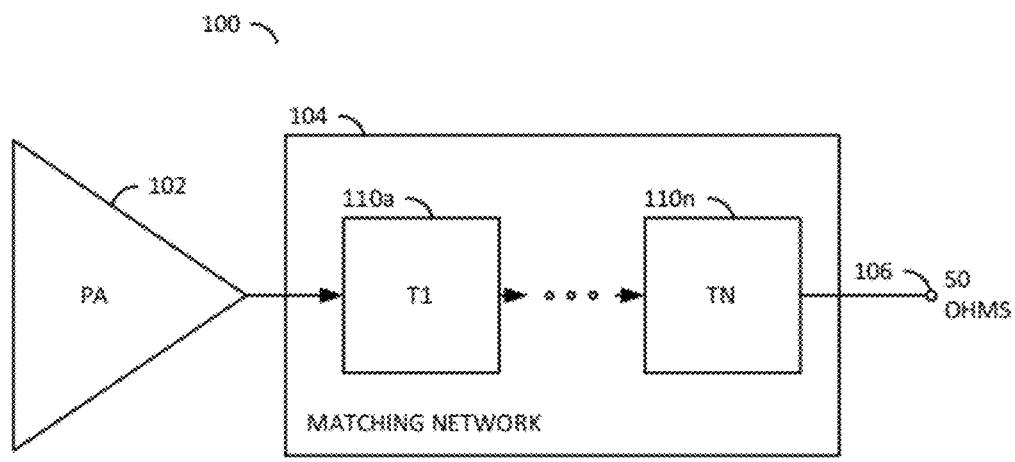
FIG. 1 is a diagram illustrating an amplifier output impedance matching configuration in accordance with an example embodiment of the present invention.

Referring to FIG. 1, a diagram of a circuit 100 is shown illustrating an amplifier output impedance matching configuration in accordance with an example embodiment of the present invention. In one example, the circuit 100 may be implemented as part of monolithic microwave integrated circuit (MMIC). In one example, the circuit 100 may comprise a block (or circuit) 102 and a block (or circuit) 104. The circuit 102 may implement a MMIC compatible high-power amplifier. The circuit 104 may implement a transformer-based output matching network in accordance with an example embodiment of the present invention. An output of the circuit 102 may be presented to an input of the circuit 104. An output of the circuit 104 may be presented to a load via an output lead 106. In one example, the output lead 106 may comprise a radio frequency (RF) output lead configured to present the output of the circuit 104 to a load with an impedance of 50 ohms. However, other load impedances may be implemented accordingly to meet the design criterial of a particular implementation.

The circuit 104 may comprise a number (e.g., N) of serially connected stages 110a-110n. Each of the stages 110a-110n may comprise one or more broadside-coupled impedance transformers. Edge coupled transformers generally have less effective coupling due to the construction and nature, and thus may suffer from limited bandwidth and poor loss. Edge coupled transformers generally would not provide improvement over the standard inductors and capacitors. In general, the broadside-coupled structure disclosed herein offers the most effective and best performing implementation of a broadside-coupled structure that may be configured into an impedance transformer for use in broadband matching power amplifier networks.

In one example, the transformers in the stages 110a-110n may be implemented based upon the teachings presented herein using conventional techniques (e.g., Ruthroff style, microstrip MMIC compatible, broadside-coupled transformers). In another example, one or more of the stages 110a-110n may be implemented using an improved bandwidth broadside-coupled transformer structure described in a co-pending U.S. patent application Ser. No. 13/096,371, filed Apr. 28, 2011, and entitled "BROADSIDE-COUPLED TRANSFORMER WITH IMPROVED BANDWIDTH," which is herein incorporated by reference in its entirety.

For broadband amplifiers, transformers generally make impedance matching easier, because the ideality of transformers may be maintained over a broader bandwidth than the ideality of lumped element matching elements, such as spiral inductors on high dielectric constant substrates. Typically, Bode-Fano type limitations are cited for causing difficulties when matching low impedances, as found in power amplifiers, over broad bandwidths. However, the Bode-Feno type limitations are rarely the actual case. The real source of matching problems in broadband amplifiers is generally caused by higher frequency resonances that may occur in the capacitors and inductors that are generally used to create the matching networks. Narrow band amplifiers do not suffer from the above problem. However, octave to multi-octave amplifiers do suffer from the above problem.

Transformers maintain ideality over a broader bandwidth better than inductors over a similar bandwidth. Ideality is where the transformer behave like pure transformers. Transformers are broadband and can fundamentally help the performance of a power amplifier. Transformers also simplify the matching networks within a power amplifier. Transformers may allow removal of lossy and less ideal matching elements, and thus may allow field effect transistors (FETs) to be combined more efficiently.

Figure 2:
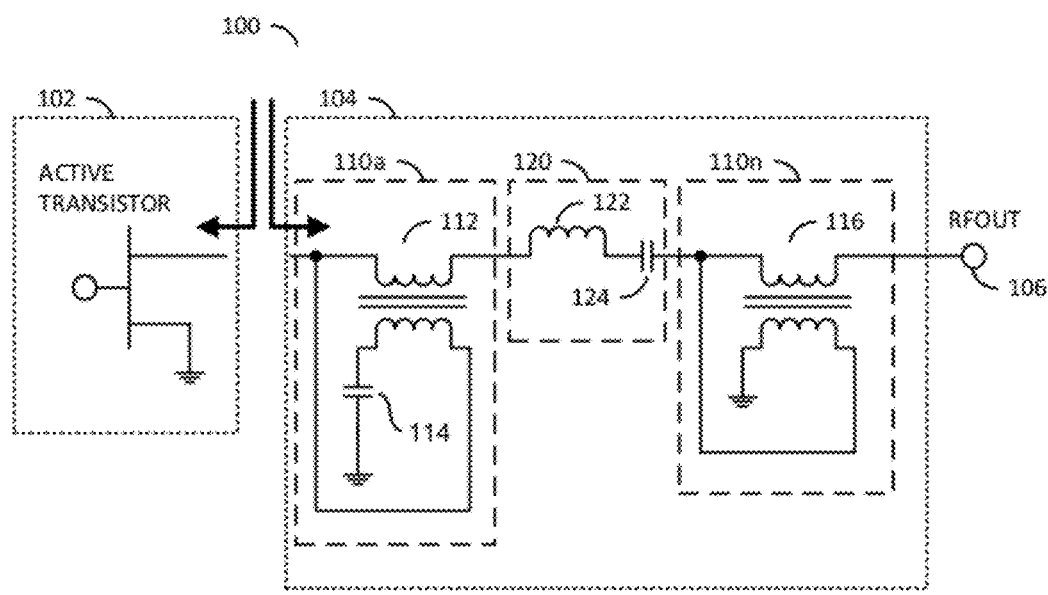
FIG. 2 is a schematic diagram illustrating an example implementation of the amplifier output impedance matching configuration of FIG. 1.

Referring to FIG. 2, a schematic diagram is shown illustrating an example implementation of the circuit 100 of FIG. 1. In one example, the circuit 102 may be represented as an active transistor. However, multiple transistors are generally implemented to achieve power specifications. The circuit 104 is generally configured to provide a proper loadline to the transistor(s) of the circuit 102. The circuit 104 may be implemented, in one example, as a dual (or two stage) transformer matching network. For example, a first stage 110a may be coupled to a second stage 110n. The circuit 110a may comprise, in one example, a transformer 112 and a capacitor 114. The circuit 110n may comprise, in one example, a transformer 116. In one example, the stages 110a and 110n may be coupled by a circuit 120. The circuit 120 may comprise, in one example, a single series capacitor block. In one example, the circuit 120 may comprise a connection element 122 and a capacitor 124. The connection element 122 may be implemented as a connecting line or possibly an inductor, when necessary. The circuit 120 may be implemented using conventional techniques.

The input of the circuit 110a may be presented to a first terminal and a second terminal of the transformer 112. A third terminal of the transformer 112 may be coupled to a power supply ground potential via the capacitor 114. A fourth terminal of the transformer 112 may present a signal to an input of the circuit 120. The signal received at the input of the circuit 120 may be presented to a first terminal of the connection element 122. A second terminal of the connection element 122 may be connected to a first terminal of the capacitor 124. A second terminal of the capacitor 124 may present a signal to an input of the circuit 110n. The signal presented to the input of the circuit 110n may be presented to a first terminal and a second terminal of the transformer 116. A third terminal of the transformer 116 may be coupled directly to the power supply ground potential. A fourth terminal of the transformer 116 may present a signal to the output lead 106.

Figure 3:
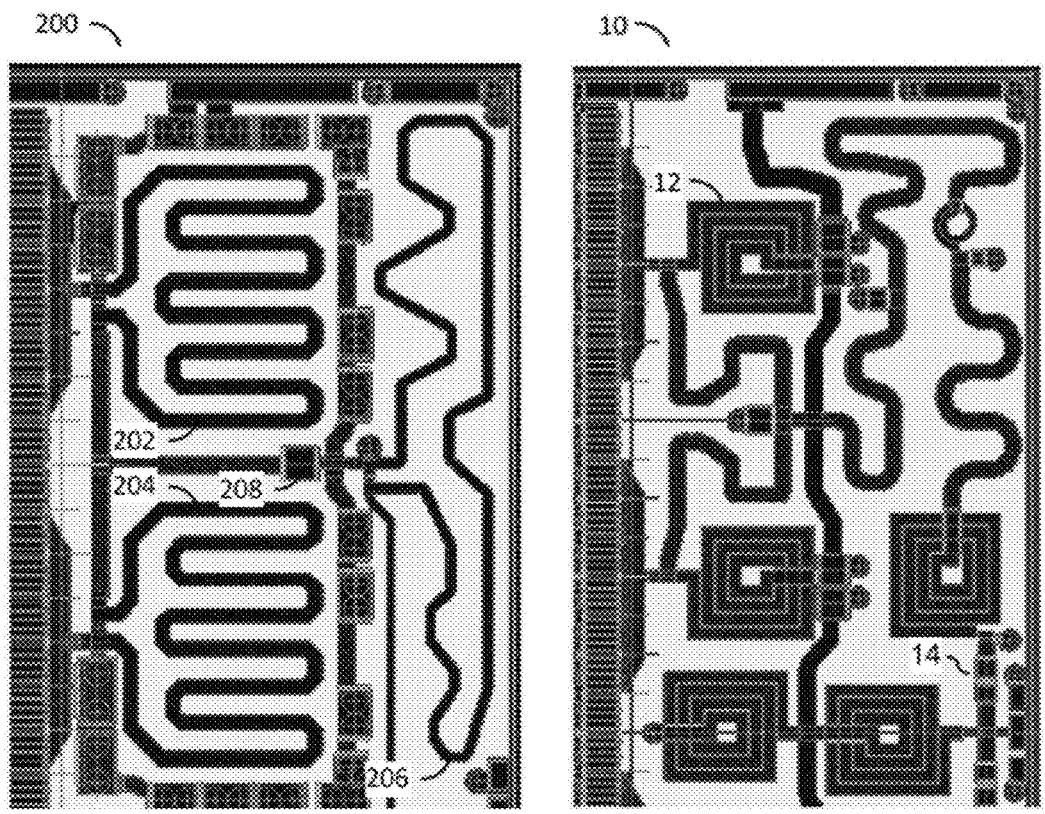
FIG. 3 is a diagram of a circuit layout 200 illustrating a novel dual-series transformer matching network in accordance with an example embodiment of the present invention and a circuit layout 10 illustrating a conventional lumped element (filter-based) matching network.
Figure 4B:
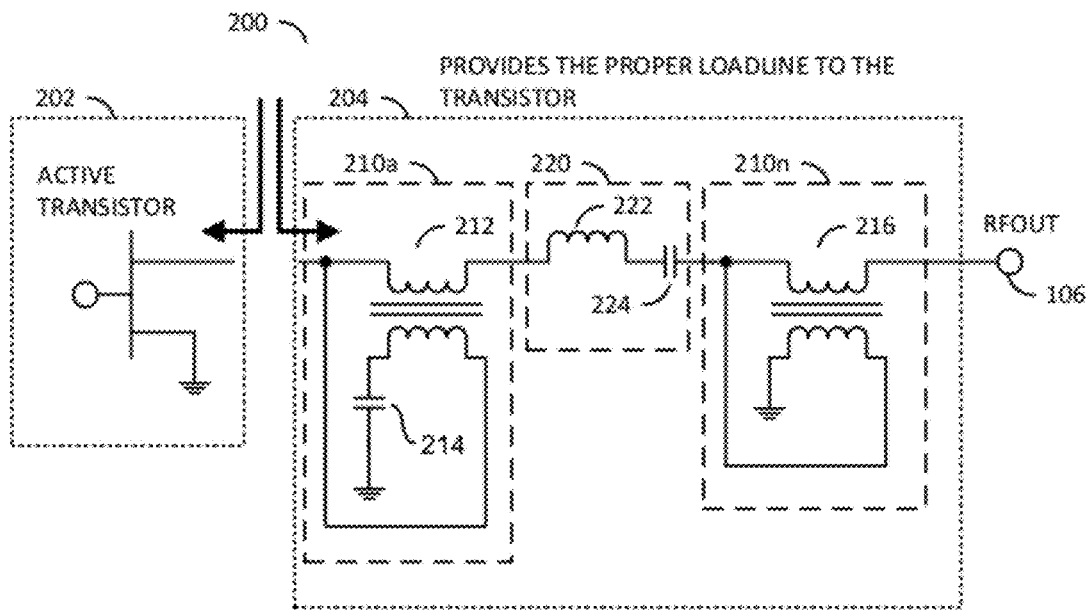
Figure 4B:
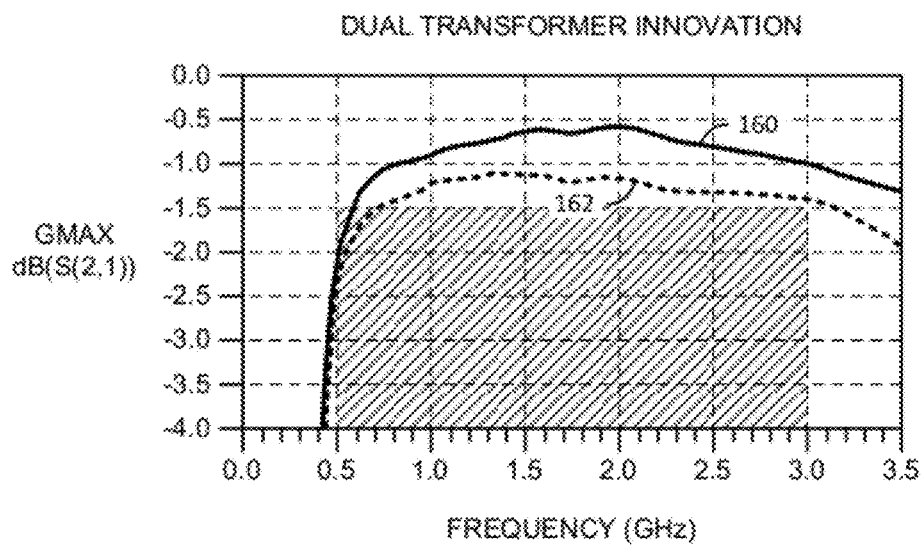

Referring to FIG. 3, a diagram is shown illustrating a circuit layout 200 of a dual-series transformer matching network in accordance with an example embodiment of the present invention and a circuit layout 10 implemented using a conventional lumped element matching element (filter-based) network. The circuit layout 10 includes spiral inductors 12 and capacitors 14. The circuit layout 200 is shown comprising a pair of first stage transformers 204 and a second stage transformer 206. The first stage transformers 204 and the second stage transformer 206 are coupled by a connecting line and a capacitor 208. Amplifiers including the circuit layouts 200 and 10 were built for a target design bandwidth and tested. The results of the testing showed that the dual-series transformer-based amplifier circuit layout 200 has superior bandwidth and gain over the target designed bandwidth. A gain performance comparison of the amplifier with the filter-based matching network and the amplifier with the dual-series transformer matching network is illustrated in FIGS. 4A and 4B.

The main design parameters of a broadside-coupled transformer generally include the physical dimensions such as the width of the traces, the length of the parallel coupled lines, and the thickness of the dielectric that separates the traces. The specific values of length and width are design specific (e.g., center frequency, bandwidth, power level, impedance, etc.). The dielectric thickness is process design dependant and usually fixed for a given process. In general, a single set of design parameters cannot be given because the design parameters are process dependent. A person of ordinary skill in the art, using the design philosophy disclosed herein to build their own process specific designs, would not use the specific processing parameters associated with the examples illustrated in FIG. 3. Instead, the skilled person would, based on the teachings contained herein, use design parameters (e.g., nitride and BCB thicknesses, particular metals, etc.)

specific to their own respective process to implement the best transformer designs for the respective process.

Referring to FIG. 4A, a diagram is shown illustrating a topology and performance of a simulated band pass filter-based output matching network design corresponding to the circuit layout 10 illustrated in FIG. 3. A cross-hatched area illustrates the target designed bandwidth. Curves 50 and 52 illustrate gain performance and insertion loss, respectively, for the filter-based matching network topology 10.

The matching network 10 is a classic filter style impedance transformation network, but modified to provide ESD (electrostatic discharge) protection at an RF output port (e.g., RFOUT). The ESD protection is provided by the shunt inductor 18 connected between the RF output port RFOUT and ground. A conventional shunt inductor 18 is implemented with two shunt inductors in series. The conventional series shunt inductors 18 are large value inductors, which are approaching resonance at the upper end of the band. The large value and resonance characteristic is one reason why the conventional shunt inductors 18 are difficult to use and contribute extra and undesirable loss to the conventional matching network 10. In order to mitigate the extra loss that the shunt inductors 18 contribute while operating out of the optimal "usable" frequency range, the widths of the inductors are made wider to help reduce loss. However, the extra width increases parasitic capacitances, which lowers the self resonant frequency, which increases the effective loss even more. From a design synthesis point of view, the shunt inductors 18 are undesirable. To reduce loss in the filter style network, fewer inductors should be used. To reduce loss, the lines need to be made wider. But like squeezing a balloon, when fewer inductors are used, transmission lines get longer to compensate and the circuit becomes impossible to realize (or squeeze into the available chip space).

The topology 10 is generally characterized as providing ESD protection at the RF output port. The topology 10 is designed to contain minimal inductors, but with maximum trace widths to (i) improve—or minimize—the dissipative loss of the matching network and (ii) promote the realizability of the matching network. With the conventional technique, a five segment matching network is required to introduce a sufficient number of transmission poles to meet the target design bandwidth.

Referring to FIG. 4B, a diagram is shown illustrating a topology and performance of the two stage transformer-based output matching network design corresponding to the circuit layout 200 illustrated in FIG. 3. Similar to FIG. 4A, a shaded area illustrates the target designed bandwidth. Curves 160 and 162 illustrate minimum dissipative insertion loss (e.g., Gmax) and load matched insertion loss, respectively, for the dual-series transformer-based output matching network topology of the circuit layout 200. ESD protection at the RF output port 106 is built into the output matching network and comes for free—no penalty. The transformer-based output matching topology in accordance with an embodiment of the present invention may (i) supply bias to the load through the transformers, (ii) have lower loss, (iii) provide broader bandwidth, and (iv) provide a greatly simplified matching network.

Comparing FIGS. 4A and 4B, the dual-series transformer-based output matching network in accordance with embodiments of the present invention generally exhibits significant improvement in bandwidth and insertion loss when compared to the conventional filter-based matching network. The output matching network loss performance results shown in FIGS. 4A and 4B may be demonstrated by fabricating the two amplifier layouts 200 and 10 with identical input and inter-stage matching networks and identical FET peripheries. The only difference between the amplifier layout 200 and the amplifier layout 10 is the respective output matching network.

Figure 5A:
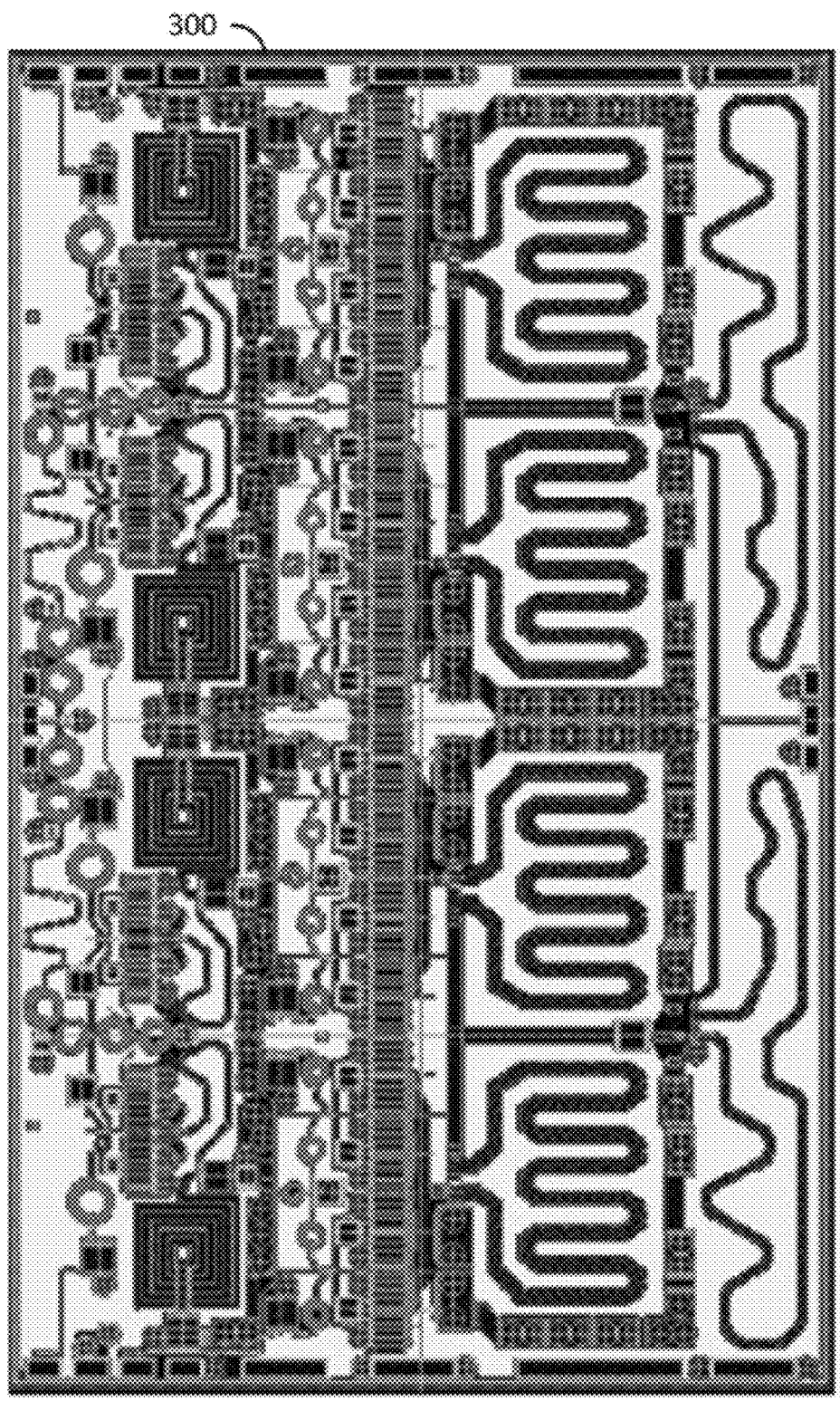
FIG. 5A is a diagram illustrating a circuit layout 300 for an improved bandwidth power amplifier implemented with dual series transformers in the output impedance matching network in accordance with an example embodiment of the present invention.
Figure 5B:
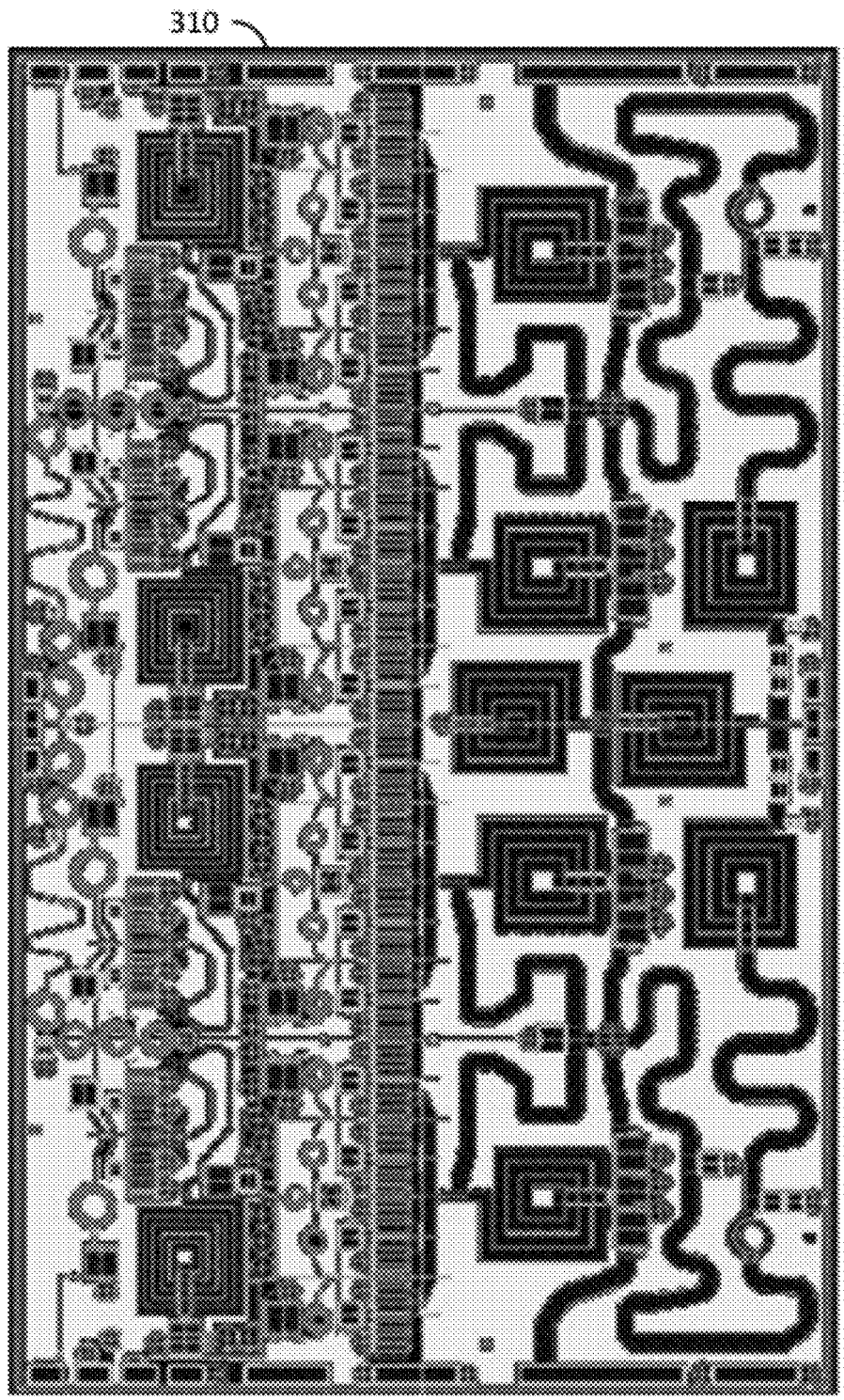
FIG. 5B is a diagram illustrating a circuit layout 310 for an amplifier implemented with a conventional lumped element and distributed matching network.
Figure 5C:
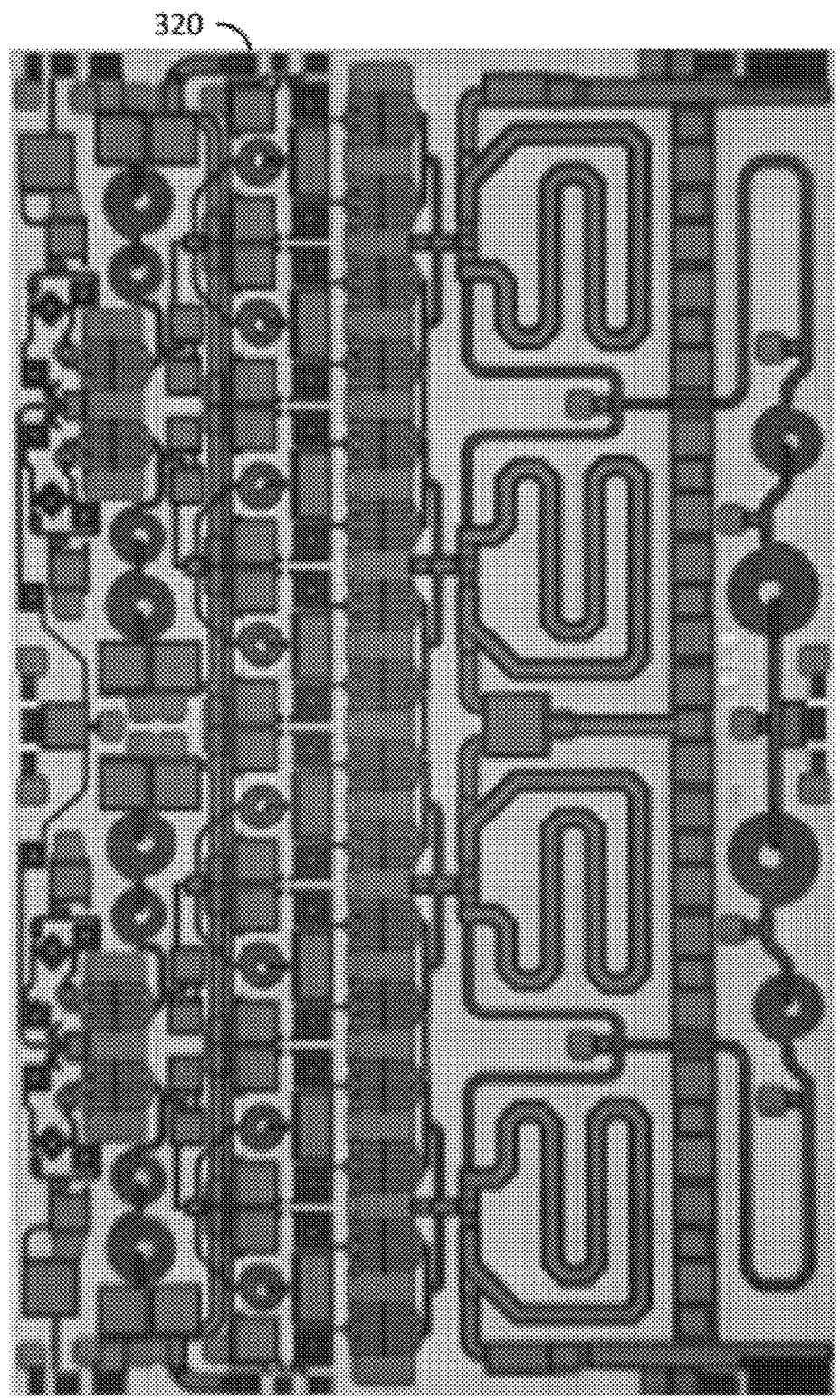
FIG. 5C is a diagram illustrating a circuit layout 320 for an amplifier implemented with a conventional single transformer and lumped element matching network.

Referring to FIGS. 5A-5C, diagrams are shown illustrating an amplifier circuit layout 300 implemented with dual-series transformers in the output impedance matching network in accordance with an example embodiment of the present invention (FIG. 5A), an amplifier circuit layout 310 implemented with a conventional lumped element and distributed matching network (FIG. 5B), and an amplifier circuit layout 320 implemented with a conventional single stage transformer and lumped element matching network (FIG. 5C).

The amplifiers illustrated in FIGS. 5A and 5B generally implement the output matching networks described above in connection with FIGS. 4A and 4B. The circuit layout 320 of FIG. 5C illustrates a M/A-COM MAAP-00077 2-stage power amplifier die. The circuit layout 320 presents a conventional power amplifier design incorporating a single broadside coupled transformer in the output matching network. The conventional power amplifier design shown in FIG. 5C is fabricated using a multifunction self aligned gate (MSAG) metal semiconductor field effect transistor (MESFET) process. Although the circuit layout 320 includes one transformer, prior to the present invention the problems involved with utilizing transformers more extensively were too complex. Thus, the conventional circuit layout 320 uses only one transformer stage and continues to rely on lumped elements for the balance of the output matching network.

Figure 6:
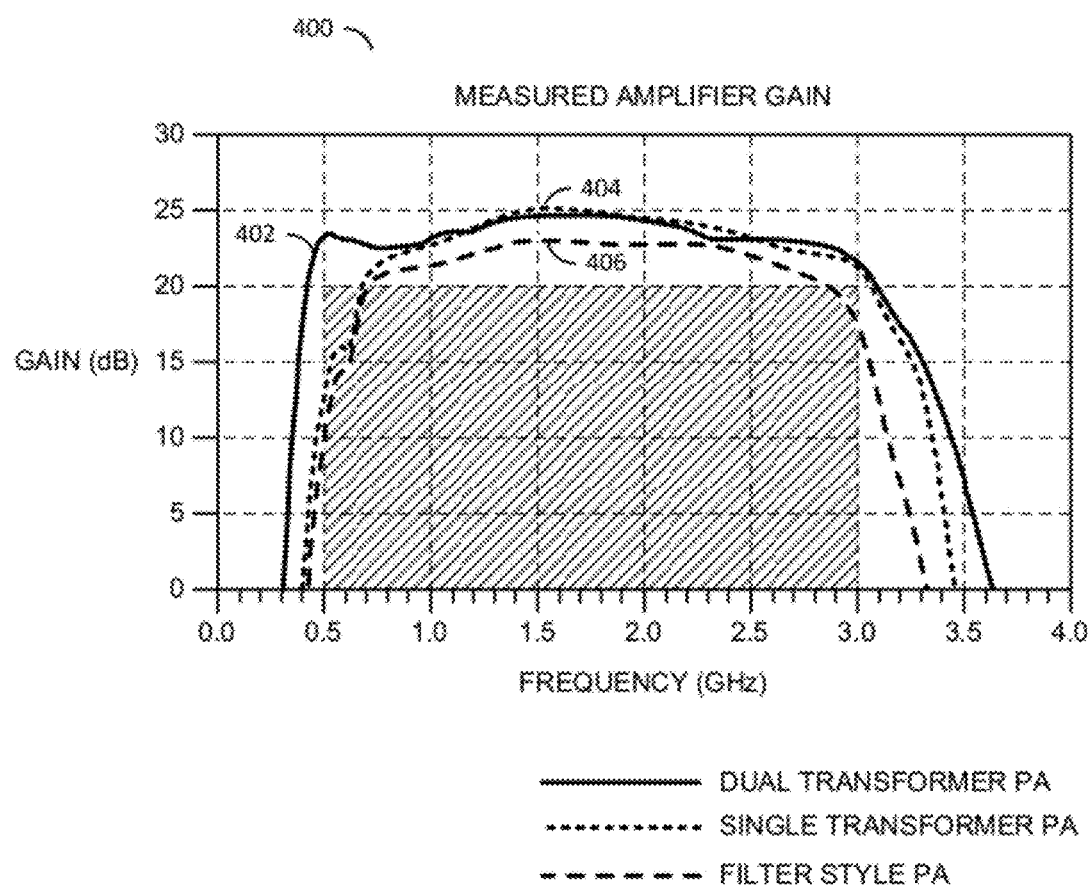
FIG. 6 is a diagram illustrating a comparison between measured amplifier gain of the amplifiers of FIGS. 5A-5C.

Referring to FIG. 6, a graph 400 is shown illustrating a comparison between measured gain performance data based upon the amplifiers circuit layouts 300, 310 and 320 illustrated in FIGS. 5A-5C. A curve 402 illustrates the gain performance of the amplifier circuit layout 300 implemented with dual-series transformers in the output impedance matching network in accordance with an example embodiment of the present invention. A curve 404 illustrates the gain performance of the amplifier circuit layout 320 implemented with the conventional single stage transformer and lumped element matching network. A curve 406 illustrates the gain performance of the amplifier circuit layout 310 implemented with the conventional lumped element and distributed matching network.

The single stage transformer in the output matching network of the conventional power amplifier circuit layout 320 provides improved performance over the conventional filter-based matching network of the power amplifier layout 310. However, with a large periphery amplifier, where power FET combining is necessary and impedances are low, a single stage of 4:1 impedance transformation is not sufficient to match a high power amplifier to 50 ohms. The single stage transformer matching network of the conventional amplifier layout 320 includes other matching network elements following the transformer stage to complete the impedance transformation from the large periphery FET to 50 ohms. Thus, implementing an amplifier with the conventional single stage transformer matching network leaves room for performance improvement. Implementation of a power amplifier with an output matching network including two or more series transformers in accordance with the teaching presented herein, generally eliminates the less ideal elements and simplifies the output matching network, which improves performance over both the conventional filter-based matching network and the conventional single stage transformer matching network.

In one example, an embodiment of the present invention generally utilizes transformers more extensively than previously possible and fully takes advantage of the broadband characteristics of transformers in a high power amplifier design. Embodiments of the present invention also include development of a scalable model of a broadside-coupled structure that is specific to the MMIC process and which had not existed prior to the present invention. The scalable model of the broadside-coupled structure generally facilitates quick prototyping and exploration of different matching network topologies, utilizing, one, two, or even three series transformers. The use of two series transformers generally allows elimination of most of the reactive components (e.g., capacitors and inductors) found in conventional matching network designs. The elimination of the reactive components generally results in matching networks with significantly better performance in both bandwidth and insertion loss. The use of two or more series transformers in the output matching network generally provides improved performance over a conventional single stage transformer amplifier (such as the M/A-COM MAAP-00077 die described above in connection with FIG. 5C), which, despite using the single transformer stage, still includes too many reactive elements in the output matching network, thus limiting the performance of the amplifier.

Due to practical network synthesis problems, the use of transformers in a MMIC matching network design is not trivial. The transformers are large and take up space. The transformers need to be configured such that the power coming from the output stage FET periphery (e.g., 16 individual transistors) may be combined, for example, to a single 50 ohm output port. The solution of these problems is not trivial. Prior to the broadside coupler model development in accordance with the present invention, the design of a dual, triple, or even quadruple series transformer based MMIC compatible matching network, was not practical and nearly impossible because of the severe difficulty in solving this type of design optimization problem using an electromagnetic simulator only. The degrees of freedom, number of variables are too high and the design optimization uncertainty increases rapidly.

The example embodiment in accordance with the present invention disclosed herein generally overcomes the practical network synthesis problems involved in, for example, combining the output of 16 transistors of low impedance into a single 50 ohm RF output port. The example embodiment presented herein generally provides the best and simplest network for a 0.5-3 GHz band. The example dual series transformer output matching network in the amplifier circuit layout 300 (illustrated in FIG. 5A) combines the outputs of 16 FETs into groups of four. The outputs of the four groups are fed to four transformers. The outputs of the four transformers are fed directly to two more transformers in series. The outputs of the two transformers are then combined for presentation to the 50 ohm output port. However, other combining topologies may be implemented accordingly to meet the design criteria of a particular implementation.

The specific arrangement of transformers is generally a design dependant result. For example, the arrangement may depend on the frequency bandwidth of the design and the number of FETs to be combined. Other topologies may be used in other MMIC designs. For example, in smaller periphery (lower power) designs a fewer number of transformers in parallel may be used. In general, the number of transformers may be varied to meet the particular design criteria of a particular amplifier. For example, instead of four transformers in parallel, feeding two transformers in parallel, which then combine and feed the 50 ohm port, another design might use eight transformers feeding four transformers feeding two transformers, or a single transformer feeding another single transformer.

Figure 7:
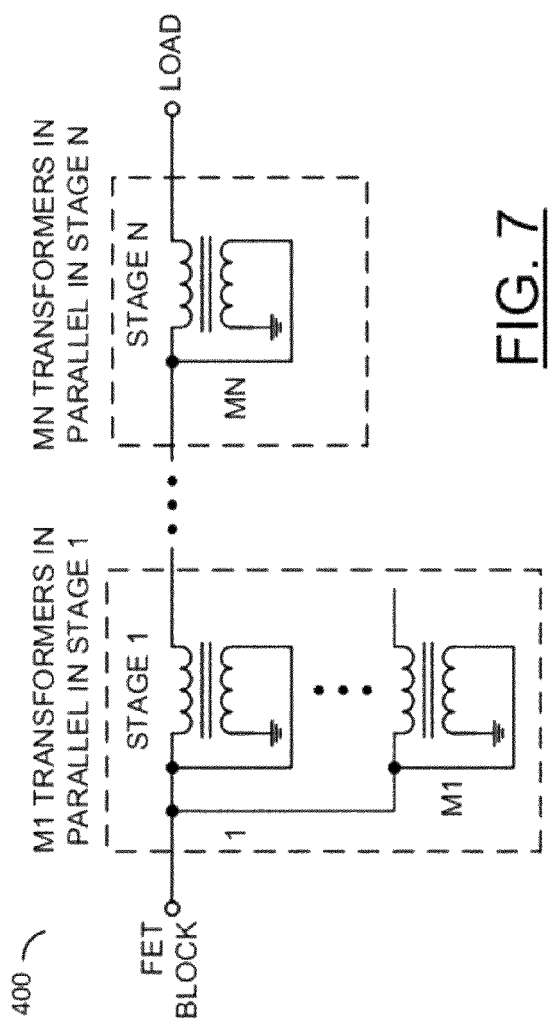
FIG. 7 is a block diagram illustrating a generalized transformer based output matching network in accordance with an embodiment of the present invention.

Referring to FIG. 7, a block diagram is shown illustrating a generalized model 400 of a transformer-based output matching network in accordance with an embodiment of the present invention. In general, the matching network 400 includes a number (e.g., N) of transformer stages connected in series. Each transformer stage may include a respective number (e.g., M1, M2, ..., MN) of transformers connected in parallel. The number of transformers implemented in parallel generally depends on how many combining nodes are used in the particular design. The number of transformers may also depend on chip space, FET periphery, and/or bandwidth. The number of transformers may be highly design dependent, but the essence is to replace the less ideal tuning elements (e.g., inductors and capacitors) with the more ideal and broadband elements (e.g., broadside-coupled transformers). In general, the question of which specific topology to implement is complicated, but comes down to how many series or stages of transformers are needed to meet the design criteria, and how many transformers are needed in parallel at each stage of transformation (e.g., two stages in the example described herein).

Figure 8:
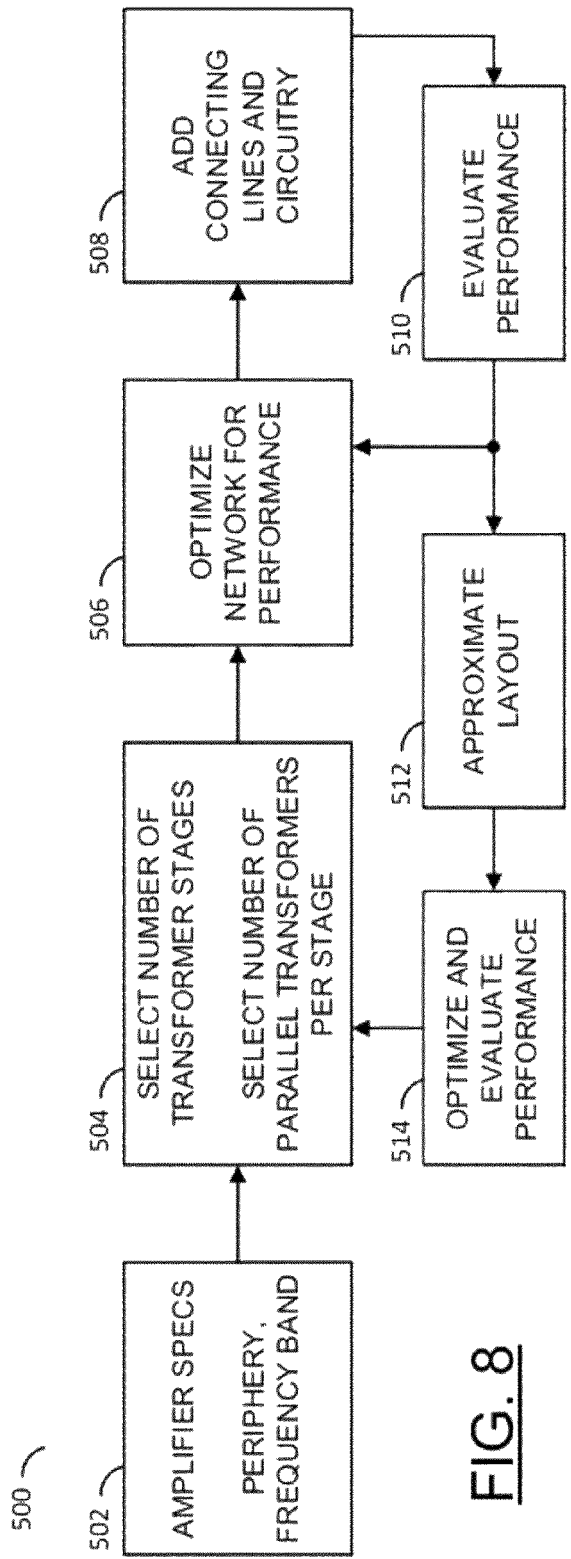
FIG. 8 is a flow diagram illustrating a process in accordance with an embodiment of the present invention.

Referring to FIG. 8, a flow diagram is shown illustrating a process 500 in accordance with an example embodiment of the present invention. In one example, the process (or method) 500 generally provides a rapid matching network prototype exploration method based on the use of one or more (no theoretical limit) transformers in a matching network design. The rapid matching network prototype exploration capability has really not existed prior to the present invention, especially with the use of transformers.

In one example, the process 500 may comprise a step (or state) 502, a step (or state) 504, a step (or state) 506, a step (or state) 508, a step (or state) 510, a step (or state) 512, and a step (or state) 514. In the step 502, amplifier specifications (e.g., periphery, frequency, bandwidth, area, process, etc.) may be specified. When the amplifier specifications have been defined, the process 500 may move to the step 504. In the step 504, a number of transformer stages and a number of transformers in each stage may be defined. When the number of transformer stages and transformers per stage have been defined, the process 500 may move to the step 506. In the step 506, the process 500 may optimize the matching network for performance. When the network has be optimized, the process 500 may move to the step 508 where connecting lines and other circuitry may be added to the design.

When the connecting lines and other circuitry have been incorporated with the transformers, the process 500 may move to the step 510. In the step 510, the amplifier performance may be evaluated (e.g., against predefined criteria). Depending upon the result of the evaluation in the step 510, the process 500 may return to the step 506 for further optimization of the transformer network or move to the step 512. In the step 512, the process 500 may generate an approximate layout for the matching network. When the layout has been approximated, the process 500 may move to the step 514. In the step 514, the layout may be optimized and the performance evaluated. Depending upon the result of the evaluation, the process 500 may return to the step 504 (e.g., if the amplifier does not meet predefine performance specification). Otherwise, the process 500 may end.

In another embodiment in accordance with the present invention, a novel electromagnetically based, scalable, broadside coupler model is provided, which generally allows rapid matching network topology exploration and optimization.

The process specific scalable broadside coupler model in accordance with the present invention may be used to design complex single or multistage transformer based matching networks (e.g., output matching networks, as well as input and interstage networks). The broadside coupler model generally incorporates the main design parameters, such as dielectric thickness, width and length. An electromagnetic simulator was used to construct a series of broadside coupler simulations spanning a wide range of physical dimensions such as dielectric thickness, trace width and trace length. An electrical model was numerically extracted for each broadside coupler for each variable dimension, and a nonlinear set of equations was fit to the model parameter variables yielding a complex, multivariable, scalable, process dependent coupler model that may be used to design impedance transformers that may be used in matching network design optimization. This is a complex process, description of which is beyond the scope of the present invention. The model allows for rapid prototyping and optimization of realistic matching networks for practical MMIC designs. The model replaces the incredibly time intensive process of design optimization of a given matching network using an electromagnetic simulator, which facilitates the design of multistage transformer based matching networks such as claimed herein. Prior to the present invention there was no model available that was adequate and could be used with accurate enough results. Although there are some broadside coupler models, they are inaccurate, academic based and useless.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The functions performed by the diagram of FIG. 8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An amplifier output impedance matching configuration comprising:
   a first broadside coupled impedance transformer receiving an input signal from a power amplifier and generating an output signal to a load; and
   one or more second broadside coupled impedance transformers connected between said first broadside coupled impedance transformer and said load through which said output signal is passed.

2. The amplifier output impedance matching configuration according to claim 1, wherein said power amplifier comprises a monolithic microwave integrated circuit (MMIC) compatible amplifier.

3. The amplifier output impedance matching configuration according to claim 1, wherein said power amplifier, said first broadside coupled impedance transformer, and said one or more second broadside coupled impedance transformers are disposed on a monolithic microwave integrated circuit (MMIC).

4. The amplifier output impedance matching configuration according to claim 1, wherein at least one of said first and said second broadside coupled impedance transformers comprises a broadside coupled structure and a compensating structure configured to reduce a half-wavelength resonance of said broadside coupled structure.

5. The amplifier output impedance matching configuration according to claim 1, further comprising a series capacitor block connected between said first broadside coupled impedance transformer and said one or more second broadside coupled impedance transformers.

6. The amplifier output impedance matching configuration according to claim 1, wherein said power amplifier comprises a multi-octave high-power amplifier.

7. The amplifier output impedance matching configuration according to claim 1, wherein at least one of said one or more second broadside coupled impedance transformers provides electrostatic discharge (ESD) protection to a lead connected to said load.

8. The amplifier output impedance matching configuration according to claim 7, wherein said lead connected to said load comprises a radio frequency (RF) lead.

9. The amplifier output impedance matching configuration according to claim 1, wherein said load is biased through said first and said second broadside coupled impedance transformers.

10. The amplifier output impedance matching configuration according to claim 1, wherein said power amplifier comprises a large periphery amplifier combining a plurality of power field effect transistors (FETs) and said load has an impedance of about 50 ohms.

11. A method of output matching a power amplifier on a monolithic microwave integrated circuit comprising:
    disposing said power amplifier circuit on a substrate of said monolithic microwave integrated circuit; and
    disposing an output impedance matching network on said substrate of said monolithic microwave integrated circuit, wherein said output impedance matching network comprises at least two broadside coupled impedance transformers connected in series between an output of said power amplifier circuit and a load.

12. The method according to claim 11, wherein one or more of said at least two broadside coupled impedance transformers each comprise a broadside coupled structure and a compensating structure configured to reduce a half-wavelength resonance of said broadside coupled structure.

13. The method according to claim 11, wherein said output impedance matching network on said substrate of said monolithic microwave integrated circuit further comprises a series capacitor block coupling said at least two broadside coupled impedance transformers.

14. The method according to claim 11, wherein said power amplifier comprises a multi-octave high-power amplifier.

15. The method according to claim 11, wherein said at least two broadside coupled impedance transformers provides electrostatic discharge (ESD) protection to a lead connected to said load.

16. The method according to claim 15, wherein said lead connected to said load comprises a radio frequency (RF) lead.

17. The method according to claim 11, further comprising biasing said load through one or more of said at least two broadside coupled impedance transformers.

18. The method according to claim 11, wherein said power amplifier comprises a large periphery amplifier combining a plurality of power field effect transistors (FETs) and said load has an impedance of about 50 ohms.

19. The method according to claim 18, wherein said output impedance matching network comprises:
    a first impedance transforming stage coupled to said plurality of power FETs and comprising a plurality of broadside coupled transformers connected in parallel; and
    a second impedance transforming stage coupled to said load and comprising at least one broadside coupled transformer, wherein said first and said second impedance transforming stages are connected in series.

20. The method according to claim 11, wherein said output impedance matching network comprises:
    a first impedance transforming stage comprising a plurality of broadside coupled transformers connected in parallel; and
    a second impedance transforming stage coupled in series with said first impedance transforming stage and comprising at least one broadside coupled transformer.

\* \* \* \* \*